(12) United States Patent
Hwang et al.

(10) Patent No.: US 12,283,646 B2
(45) Date of Patent: Apr. 22, 2025

(54) LIGHT-EMITTING DIODE (LED) DEVICE, METHOD OF MANUFACTURING THE SAME, AND DISPLAY DEVICE INCLUDING THE LED DEVICE

(71) Applicants: SAMSUNG ELECTRONICS CO., LTD., Suwon-si (KR); SEOUL NATIONAL UNIVERSITY R&DB FOUNDATION, Seoul (KR)

(72) Inventors: Kyungwook Hwang, Seoul (KR); Ho Won Jang, Seoul (KR); Junsik Hwang, Hwaseong-si (KR)

(73) Assignees: SAMSUNG ELECTRONICS CO., LTD., Suwon-si (KR); SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 537 days.

(21) Appl. No.: 17/531,210

(22) Filed: Nov. 19, 2021

(65) Prior Publication Data

US 2022/0173275 A1 Jun. 2, 2022

(30) Foreign Application Priority Data

Nov. 27, 2020 (KR) .................. 10-2020-0163350
Feb. 25, 2021 (KR) .................. 10-2021-0025973

(51) Int. Cl.
   *H01L 33/38* (2010.01)
   *H01L 27/15* (2006.01)
   *H01L 33/00* (2010.01)
   *H01L 33/40* (2010.01)

(52) U.S. Cl.
   CPC ......... *H01L 33/385* (2013.01); *H01L 27/156* (2013.01); *H01L 33/005* (2013.01); *H01L 33/382* (2013.01); *H01L 33/405* (2013.01); *H01L 2933/0016* (2013.01)

(58) Field of Classification Search
   CPC ......... H01L 33/20; H01L 33/24; H01L 33/44; H01L 33/385
   See application file for complete search history.

(56) References Cited

U.S. PATENT DOCUMENTS

| 5,966,396 A | 10/1999 | Okazaki et al. |
| 8,716,749 B2 | 5/2014 | Kim et al. |
| 2014/0027802 A1* | 1/2014 | Yu ..................... H01L 33/20 257/94 |
| 2017/0005244 A1* | 1/2017 | Bower ................ H01L 33/46 |
| 2017/0271556 A1 | 9/2017 | Yoon et al. |

FOREIGN PATENT DOCUMENTS

| JP | 10-93198 A | 4/1998 |
| JP | 3307218 B2 | 7/2002 |
| KR | 10-2015-0040440 A | 4/2015 |
| KR | 10-1640830 B1 | 7/2016 |

\* cited by examiner

*Primary Examiner* — Evan G Clinton
(74) *Attorney, Agent, or Firm* — Sughrue Mion, PLLC

(57) ABSTRACT

An LED device includes a light emission layer including a first semiconductor layer including a first surface and a second surface facing the first surface, the second surface having an area larger than an area of the first surface, an active layer on the first surface, and a second semiconductor layer on the active layer, an insulating layer on the first surface, the insulating layer defining an open region of the first semiconductor layer, a first electrode that contacts the first semiconductor layer via the open region, and a second electrode on the second semiconductor layer and contacting the second semiconductor layer.

25 Claims, 14 Drawing Sheets

LIGHT-EMITTING DIODE (LED) DEVICE, METHOD OF MANUFACTURING THE SAME, AND DISPLAY DEVICE INCLUDING THE LED DEVICE

CROSS-REFERENCE TO RELATED APPLICATIONS

This application is based on and claims priority under 35 U.S.C. § 119 to Korean Patent Application No. 10-2020-0163350, filed on Nov. 27, 2020, in the Korean Intellectual Property Office, and Korean Patent Application No. 10-2021-0025973, filed on Feb. 25, 2021, in the Korean Intellectual Property Office, the disclosures of which are incorporated by reference herein in their entireties.

BACKGROUND

1. Field

The disclosure relates to a light-emitting diode (LED) device, a method of manufacturing the same, and a display device including the LED device.

2. Description of Related Art

Liquid crystal displays (LCDs) and organic light-emitting diode (OLED) displays have been widely used as display devices. Recently, a technology for manufacturing a high-resolution display device by using a micro-light-emitting diode device has been in the spotlight.

SUMMARY

Provided are an LED device, a method of manufacturing the same, and a display device including the LED device.

Additional aspects will be set forth in part in the description which follows and, in part, will be apparent from the description, or may be learned by practice of embodiments of the disclosure.

According to an embodiment, an LED device may include a light emission layer including a first semiconductor layer including a first surface and a second surface facing the first surface and having an area larger than an area of the first surface, an active layer on the first surface, and a second semiconductor layer on the active layer, an insulating layer on the first surface, that defines an open region of the first semiconductor layer, a first electrode that contacts the first semiconductor layer via the open region, and a second electrode on the second semiconductor layer, that contacts the second semiconductor layer, and an angle between a surface of the insulating layer contacting the active layer and the second semiconductor layer, and a surface of the insulating layer contacting the first semiconductor layer may be less than 90°. In accordance with an aspect of the disclosure, a light-emitting diode (LED) device includes a light emission layer including a first semiconductor layer including a first surface and a second surface facing the first surface, the second surface having an area larger than an area of the first surface; an active layer on the first surface; and a second semiconductor layer on the active layer; an insulating layer on the first surface, the insulating layer defining an open region of the first semiconductor layer; a first electrode that contacts the first semiconductor layer at the open region; and a second electrode on the second semiconductor layer and contacting the second semiconductor layer, wherein an angle between a surface of the insulating layer contacting the active layer and the second semiconductor layer and a surface of the insulating layer contacting the first semiconductor layer is less than 90°.

The first electrode may contact the first surface of the first semiconductor layer.

The first and second electrodes may include reflective electrodes.

The LED device may have a size of about 100 μm by about 100 μm or less.

The LED device may have a horizontal electrode structure in which at least a part of the first electrode and at least a part of the second electrode are arranged in a direction that faces the first surface.

Respective driver connection surfaces of the first and second electrodes may be formed at a same distance from the second surface.

The first electrode may include an extension extending to an upper portion of the insulating layer.

The first semiconductor layer may further include a defect line formed on the second surface.

The defect line may be parallel with an edge of the second surface of the first semiconductor layer.

The first semiconductor layer may further include a notch portion formed on the first surface and recessed toward the second surface.

The notch portion may be formed in a direction parallel with an edge of the LED device.

The first semiconductor layer may further include a valley portion formed on the first surface along a periphery of the first electrode and recessed toward the second surface.

In accordance with an aspect of the disclosure, a light-emitting diode (LED) device may include a light emission layer including a first semiconductor layer including a first surface and a second surface facing the first surface, the second surface having an area larger than an area of the first surface; an active layer on the first surface; and a second semiconductor layer on the active layer; an insulating layer on the first surface, the insulating layer defining an open region of the first semiconductor layer; a first electrode that contacts the first semiconductor layer at the open region; and a second electrode on the second semiconductor layer and contacting the second semiconductor layer, wherein an angle between a surface of the insulating layer contacting the active layer and the second semiconductor layer and a surface of the insulating layer contacting the first semiconductor layer is greater than 90°.

In accordance with an aspect of the disclosure, a method of manufacturing a light-emitting diode (LED) device includes forming a membrane on a substrate; forming a first semiconductor layer on the membrane; forming an insulating layer that covers a part of the first semiconductor layer; forming an active layer on a region of the first semiconductor layer on which the insulating layer is not formed; forming a second semiconductor layer on the active layer; removing a part of the insulating layer to form an open region in which the first semiconductor layer is exposed; forming a first electrode that contacts the first semiconductor layer at the open region; and forming a second electrode that contacts the second semiconductor layer.

The forming of the membrane may include forming a sacrificial layer pattern on the substrate; forming a membrane material layer on the substrate to cover the sacrificial layer; removing the sacrificial layer pattern; and crystallizing the membrane material layer.

The substrate may include a sapphire substrate and the membrane may include alumina.

The membrane may further include a plurality of rectangular bar patterns parallel with each other.

The forming of the first semiconductor layer may include fusing a first semiconductor material grown on a first rectangular bar pattern of the membrane, with a second semiconductor material grown on an upper portion of a second rectangular bar pattern of the membrane adjacent to the first rectangular bar pattern.

The removing the part of the insulating layer may include a photolithography process.

In accordance with an aspect of the disclosure, a display device includes a pixel array in which unit pixels are arranged in a two-dimensional array, where the unit pixels include a first pixel that emits a first color light and a second pixel that emits a second color light, wherein the first pixel and the second pixel include different light-emitting diode (LED) devices from each other, wherein at least one LED device of the LED devices includes a light emission layer including a first semiconductor layer including a first surface and a second surface facing the first surface, the second surface having an area larger than an area of the first surface; an active layer on the first surface; and a second semiconductor layer on the active layer; an insulating layer on the first surface, that defines an open region of the first semiconductor layer; a first electrode that contacts the first semiconductor layer at the open region; and a second electrode on the second semiconductor layer and contacting the second semiconductor layer, wherein an angle between a surface of the insulating layer contacting the active layer and the second semiconductor layer and a surface of the insulating layer contacting the first semiconductor layer is less than 90°.

The first electrode may contact the first surface of the first semiconductor layer.

The first and second electrodes may include reflective electrodes.

The LED device may have a size of about 100 μm by about 100 μm or less.

The at least one LED device may have a horizontal electrode structure in which at least a part of the first electrode and at least a part of the second electrode are arranged in a direction that faces the first surface.

Respective driver connection surfaces of the first and second electrodes may be formed at a same distance from the second surface.

The first electrode may include an extension extending to an upper portion of the insulating layer.

The first semiconductor layer may further include a defect line formed on the second surface.

The defect line may be parallel with an edge of the second surface of the first semiconductor layer.

The first semiconductor layer may further include a notch portion formed on the first surface and recessed toward the second surface.

The notch portion may be formed in a direction parallel with an edge of the at least one LED device.

The first semiconductor layer may further include a valley portion formed on the first surface along a periphery of the first electrode and recessed toward the second surface.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1A:
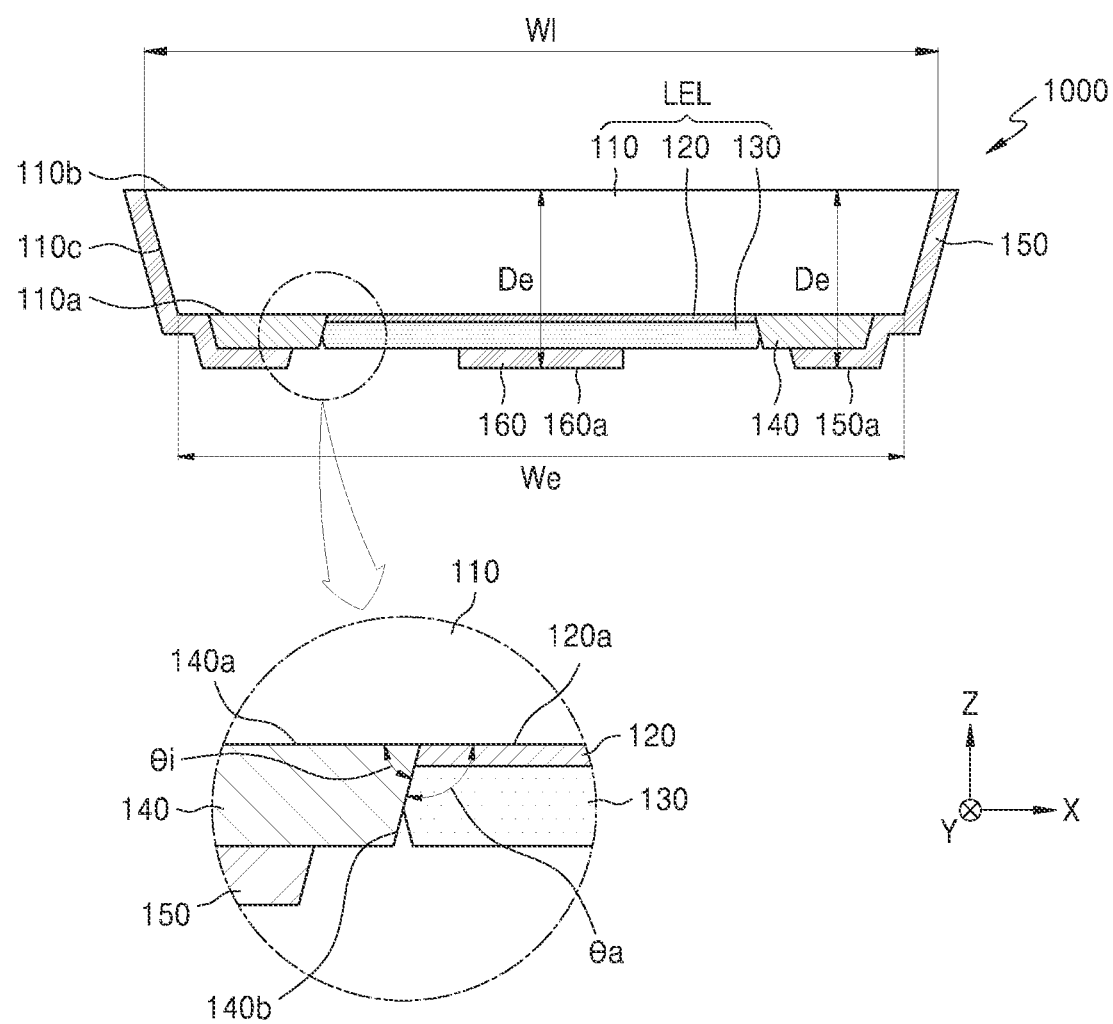
FIG. 1A is a cross-sectional view of a light-emitting diode (LED) device according to an embodiment.

Reference will now be made in detail to embodiments, examples of which are illustrated in the accompanying drawings, wherein like reference numerals refer to like elements throughout. In this regard, embodiments may have different forms and should not be construed as being limited to the descriptions set forth herein. Accordingly, embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, example embodiments will be described in detail with reference to the accompanying drawings. In the following drawings, like reference numerals refer to like elements, and sizes of elements in the drawings may be exaggerated for clarity and convenience of description. The described embodiments are merely examples, and various modifications are possible from these embodiments.

An expression "above" or "on" used herein may include not only "immediately on in a contact manner" but also "on in a non-contact manner". The singular expression also includes the plural meaning as long as it does not inconsistent with the context. In addition, when an element "includes" or "comprises" an element, unless there is a particular description contrary thereto, the element can further include other elements, not excluding the other elements.

The term "the" and other demonstratives similar thereto should be understood to include a singular form and plural forms. The operations of all methods described herein can be performed in any suitable order unless otherwise indicated herein or otherwise clearly contradicted by context. The disclosure is not limited to the described order of the operations.

In the disclosure, the term such as ". . . unit" or ". . . module" should be understood as a unit in which at least one function or operation is processed and may be embodied as hardware, software, or a combination of hardware and software.

The lines or connecting elements between elements shown in the drawings are intended to represent exemplary functional relationships and/or physical or logical couplings between the various elements, and many alternative or additional functional relationships, physical connections or logical connections may be present in a practical device.

The use of any and all examples, or example language provided herein, is intended merely to describe the technical spirit of the disclosure in more detail and does not pose a limitation on the scope of the disclosure unless otherwise claimed.

Figure 1B:
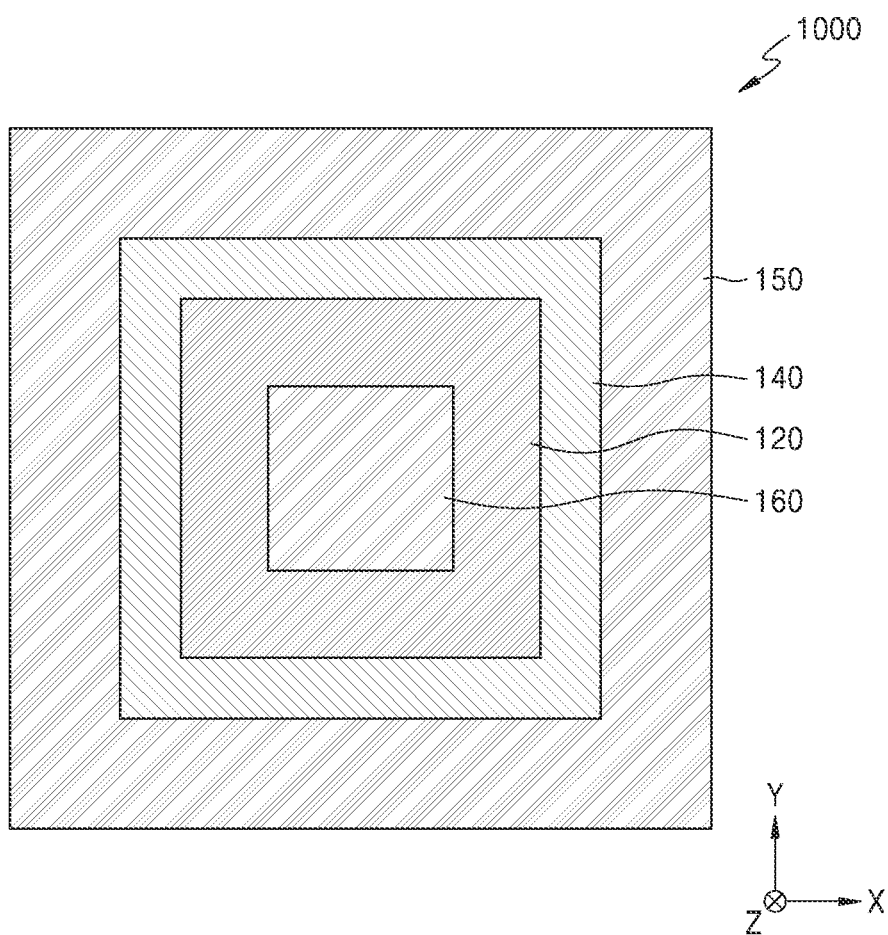
FIG. 1B is an example of a plan view of the LED device of FIG. 1A viewed from an electrode formation surface.
Figure 1C:
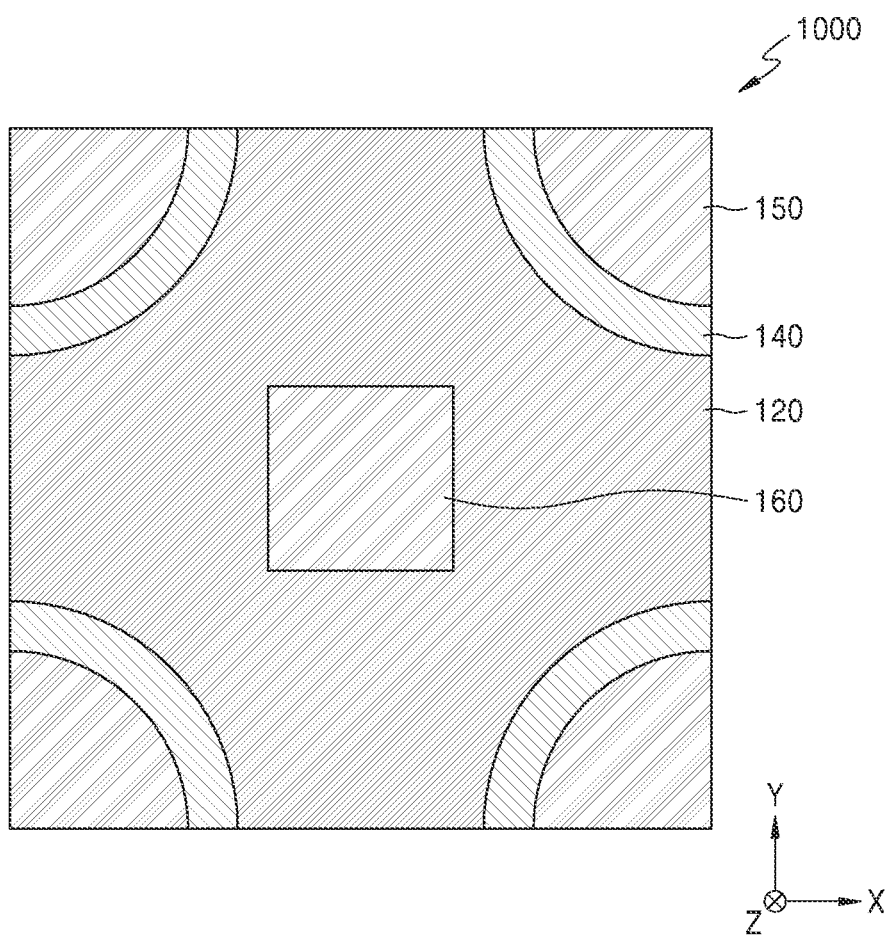
FIG. 1C is an example of a plan view of the LED device of FIG. 1A viewed from the electrode formation surface.
Figure 1D:
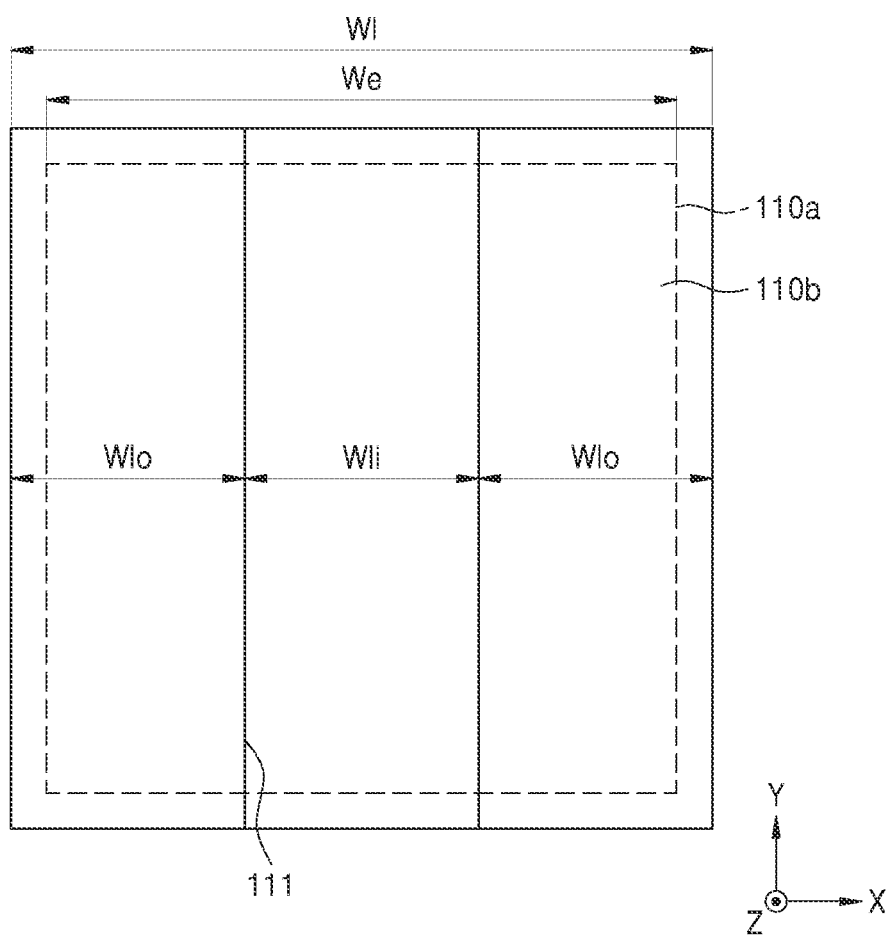
FIG. 1D is a plan view of a light emission surface of the first semiconductor layer of FIG. 1A.

FIG. 1A is a cross-sectional view of a light-emitting diode (LED) device according to an embodiment, FIG. 1B is an example of a plan view of the LED device of FIG. 1A viewed from an electrode formation surface, FIG. 1C is an example of a plan view of the LED device of FIG. 1A viewed from the electrode formation surface, and FIG. 1D is a plan view of a light emission surface of the first semiconductor layer of FIG. 1A.

Referring to FIG. 1A, the LED device 1000 has a horizontal electrode structure. Specifically, the LED device 1000 may include a light emission layer LEL and first and second electrodes 150 and 160 each provided at one side of the light emission layer LEL. Here, the light emission layer LEL may be an inorganic-based light emitting diode layer.

The light emission layer LEL may include a first semiconductor layer 110, an active layer 120, and a second semiconductor layer 130. The first semiconductor layer 110 may have a three-dimensional shape with a thickness relatively greater than those of the active layer 120 and the second semiconductor layer 130. Specifically, as shown in FIG. 1, the first semiconductor layer 110 may include an electrode formation surface 110a having a first width We and a light emission surface 110b having a second width WI greater than the first width We, and an area of the electrode formation surface 110a may be smaller than an area of the light emission surface 110b. The electrode formation surface 110a may be a surface on a side of the first semiconductor layer 110 on which the first and second electrodes 150 and 160 are formed, and the emission surface 110b may be a surface on a side of the first semiconductor layer 110 from which light generated by the light emission layer LEL is emitted to the outside.

The first semiconductor layer 110 may be an n-type semiconductor or a p-type semiconductor, and here, a case of an n-type semiconductor will be described as an example. The first semiconductor layer 110 may include a III-V group n-type semiconductor, for example, an n-type nitride semiconductor. The nitride semiconductor may include, for example, GaN, InN, AlN, or a combination thereof, and for example, the first semiconductor layer 110 may include n-GaN. The first semiconductor layer 110 may have a single-layer or multi-layer structure.

The active layer 120 and the second semiconductor layer 130 may have thicknesses relatively smaller than that of the first semiconductor layer 110. The active layer 120 may cover all or a part of the electrode formation surface 110a of the first semiconductor layer 110 having the three-dimensional shape. The active layer 120 may cover all or a part of lateral surfaces 110c and a part of the light emission surface 110b in addition to the electrode formation surface 110a.

The active layer 120 may have a multi-quantum well (MQW) or single-quantum well (SQW) structure, and may generate light of a predefined wavelength band as electrons are combined with holes. The active layer 120 may include a III-V group semiconductor, for example, a nitride semiconductor. For example, the active layer 120 may include GaN.

The second semiconductor layer 130 may cover the active layer 120. The second semiconductor layer 130 may be a semiconductor layer doped with a different material from that of the first semiconductor layer 110, and may include, for example, a III-V group p-type semiconductor, for example, a p-type nitride semiconductor. For example, the second semiconductor layer 130 may include p-GaN. The second semiconductor layer 130 may have a single-layer or multi-layer structure.

An insulating layer 140 may be formed to cover a part of the electrode formation surface 110a of the first semiconductor layer 110, and the insulating layer 140 may extend to cover all or a part of the lateral surfaces 110c. The insulating layer 140 may form or define an open region on which the active layer 120 and the second semiconductor layer 130 are not formed, on the electrode formation surface 110a of the first semiconductor layer 110 and/or the lateral surfaces 110c. In other words, the open region may be a region where the first electrode 150 contacts the first semiconductor layer 110. The insulating layer 140 may also be between the first electrode 150 and the second semiconductor layer 130 such that the first electrode 150 is not electrically connected to the second semiconductor layer 130.

The insulating layer 140 may include an anti-growth material (e.g., $SiO_2$, SiN, or the like) that inhibits growth of the active layer 120 and the second semiconductor layer 130.

Referring to the partially enlarged view in FIG. 1A, an angle θi between a surface 140a of the insulating layer 140 contacting the first semiconductor layer 110, that is, a portion of the electrode formation surface 110a contacting the insulating layer 140, and a surface 140b of the insulating layer 140 contacting the active layer 120 and the second semiconductor layer 130 may be less than 90 degrees (°).

In addition, an angle θa between a surface 120a of the active layer 120 contacting the first semiconductor layer 110, that is, a portion of the electrode formation surface 110a contacting the active layer 120, and a surface 140b of the insulating layer 140 contacting the active layer 120 and the second semiconductor layer 130 may be greater than 90 degrees.

Because the insulating layer 140 of FIG. 1A is formed prior to the formation of the active layer 120 and the second semiconductor layer 130, rather than being formed in a region from which the active layer 120 and the second semiconductor layer 130 are partially etched, a contact structure may be formed as described above.

The first electrode 150 may be electrically connected to the first semiconductor layer 110. Specifically, the first electrode 150 may contact a part of the electrode formation surface 110a and/or all or a part of the lateral surfaces 110c of the first semiconductor layer 110 through the open region on which the insulating layer 140 is not provided. The first electrode 150 may include an extension extending to an upper portion of the insulating layer 140 (e.g., to a surface of the insulating layer 140 opposite to the surface of the insulating layer 140 that contacts the first semiconductor layer 110).

The second electrode 160 may be electrically connected to the second semiconductor layer 130. Specifically, the second electrode 160 may be on the second semiconductor layer 130.

The first and second electrodes 150 and 160 may be reflective electrodes and may include a metal material having excellent conductivity. The first electrode 150 may be an n-type electrode, and the second electrode 160 may be a p-type electrode. The first and second electrodes 150 and 160 may have a horizontal electrode structure in which the electrodes are formed on the same layer, and driver connection surfaces 150a and 160a of the first and second electrodes 150 and 160 may be formed at the same distance De from the light emission surface 110b. The driver connection surfaces 150a and 160a may be surfaces through which a driver for driving the LED device 1000 is connected to the first and second electrodes 150 and 160, respectively.

Referring to FIG. 1B, the first electrode 150 may be in a region surrounding edges of the LED device 1000, and the second electrode 160 may be in the center of the LED device 1000. However, the electrode arrangement of FIG. 1B is only an example, and various arrangements such as the first electrode 150 in four corner regions of the LED device 1000 as illustrated in FIG. 1C are possible.

Referring to FIG. 1D, the LED device 1000 may include one or more defect lines 111 formed on the light emission surface 110b of the first semiconductor layer 110. The defect line 111 may be caused by a defect that occurs when a plurality of semiconductors that separately grow at different positions contact each other to be fused into a single mass. A greater number of defects, for example, dislocation, may be formed around the defect line 111 than other locations. The defect line 111 may also have a darker color than other regions.

The defect line 111 may be in a direction parallel to an edge of the light emission surface 110b, and in a case where two or more defect lines 111 are formed, a gap Wli between the defect lines 111 may be smaller than a gap Wlo between the defect line 111 and an edge of the light emission surface 110b.

In the LED device 1000 having the above-described structure, when a voltage is applied to each of the first and second electrodes 150 and 160, electrons may be combined with holes in the active layer 120 of the light emission layer LEL, thus light having a predefined wavelength band may be generated, and the light may be emitted to the outside of the LED device 1000. By appropriately selecting a material and/or a structure of the light emission layer LEL and adjusting a band gap, the LED device 1000 may emit light of a desired wavelength band. For example, the LED device 1000 may be applied to a pixel of a display device, and may be configured to emit red light, green light, or blue light.

The LED device 1000 may include a microscopic LED device. Specifically, the LED device 1000 may have a size of, for example, about 100 μm by 100 μm or less, and may have a thickness of about 10 μm or less.

In the LED device of FIG. 1A, as will be described with reference to FIGS. 5A to 5L below, because the light emission layer LEL is grown on a crystallized membrane spaced apart from a substrate with a cavity therebetween and the active layer 120 does not include an etched region, light emission efficiency may be improved.

Figure 2A:
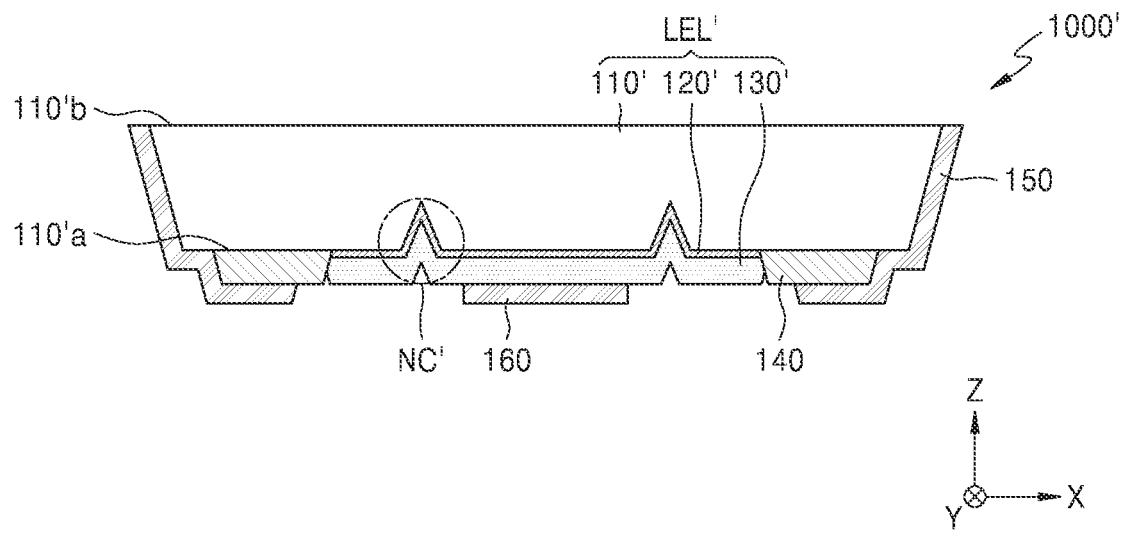
FIG. 2A is a cross-sectional view of an LED device according to an embodiment.
Figure 2B:
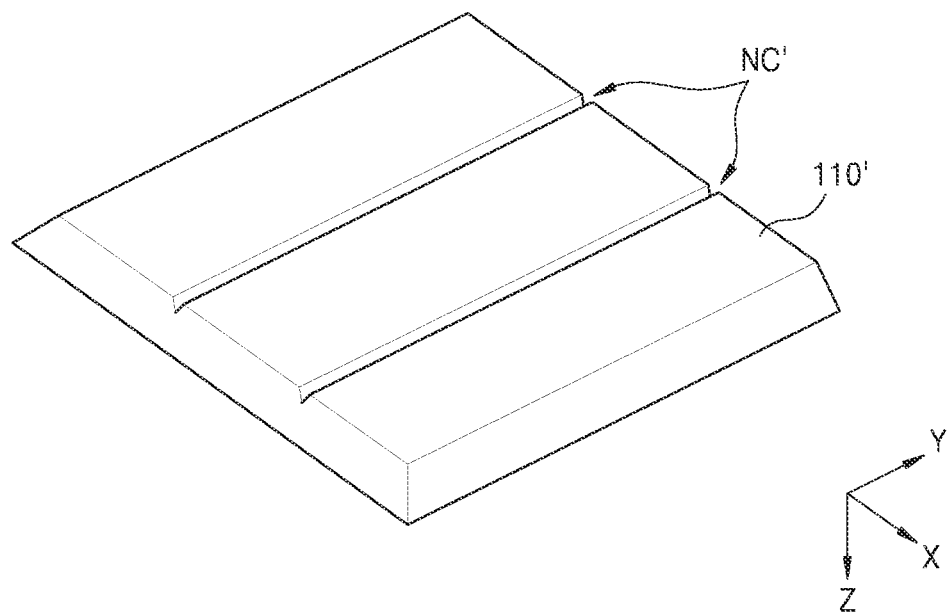
FIG. 2B is a perspective view of a first semiconductor layer included in the LED device of FIG. 2A viewed from the direction of the electrode formation surface.

FIG. 2A is a cross-sectional view of an LED device according to an embodiment, and FIG. 2B is a perspective view of the first semiconductor layer of FIG. 2A viewed from the direction of the electrode formation surface.

Referring to FIGS. 2A and 2B, an LED device 1000' may include a light emission layer LEL' including a first semiconductor layer 110', an active layer 120', and a second semiconductor layer 130', and first and second electrodes 150 and 160 each provided on one side of the light emission layer LEL'. Description of the same components as those described in the above embodiments will be omitted.

The light emission layer LEL' of FIGS. 2A and 2B may include a notch portion NC' formed on an electrode formation surface 110'a of the first semiconductor layer 110'. The notch portion NC' may be a region recessed in a 'V' shape in a direction from an electrode formation surface 110'a to a light emission surface 110'b, and may be formed in a direction parallel to an edge of the LED device 1000'. Because the LED device 1000' of FIG. 2A includes the notch portion NC', a light emitting area of the active layer 120' may be increased, and luminance efficiency may be improved. The notch portion NC' may be formed at a position corresponding to the defect line 111 described with reference to FIG. 1D.

Figure 3A:
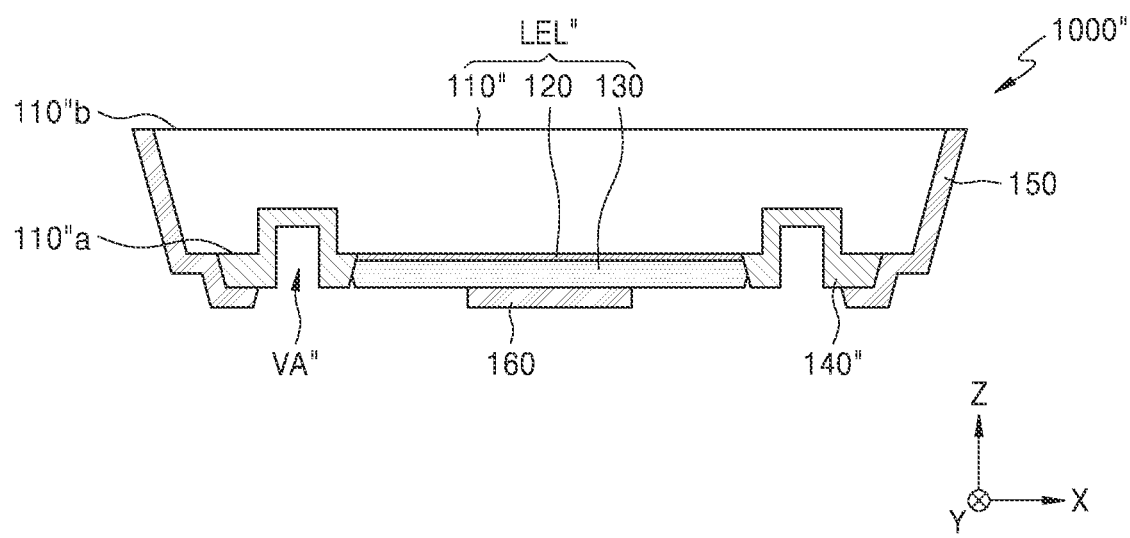
FIG. 3A is a cross-sectional view of an LED device according to an embodiment.
Figure 3B:
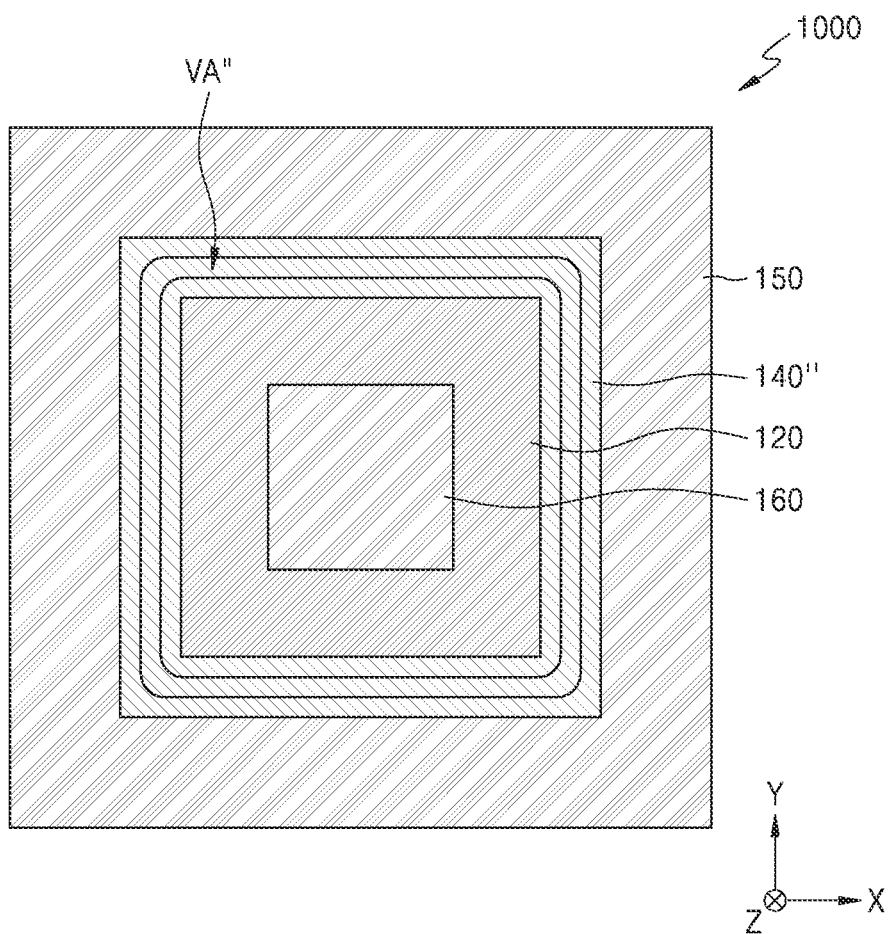
FIG. 3B is a plan view of the LED device of FIG. 3A viewed from the electrode formation surface.

FIG. 3A is a cross-sectional view of an LED device according to an embodiment, and FIG. 3B is a plan view of the LED device of FIG. 3A viewed from the electrode formation surface.

Referring to FIGS. 3A and 3B, an LED device 1000" may include a light emission layer LEL" including a first semiconductor layer 110", the active layer 120, and the second semiconductor layer 130, and the first and second electrodes 150 and 160 each provided on one side of the light emission layer LEL". Description of the same components as those described in the above embodiments will be omitted.

The first semiconductor layer 110" of FIGS. 3A and 3B may include a valley portion VA" formed on an electrode formation surface 110"a. The valley portion VA" may be a region recessed in a 'U' shape in a direction from the surface of the electrode formation surface 110'a to the light emission surface 110'b. The valley portion VA" may be provided along a periphery of the first electrode 150 such that the first electrode 150 is isolated from other regions including the second semiconductor layer 130. For example, as illustrated in FIG. 3B, the valley portion VA" may be provided in a region of an insulating layer 140" between the first electrode 150 and the second semiconductor layer 130.

When the LED device 1000" is coupled to a driving substrate or the like, pressure may be applied to the first and second electrodes 150 and 160, and even in a case where the first and second electrodes 150 and 160 are pressed by the pressure and spread in the horizontal direction, the valley portion VA" may prevent the first electrode 150 from being connected to the second semiconductor layer 130 and/or the second electrode 160.

Figure 4:
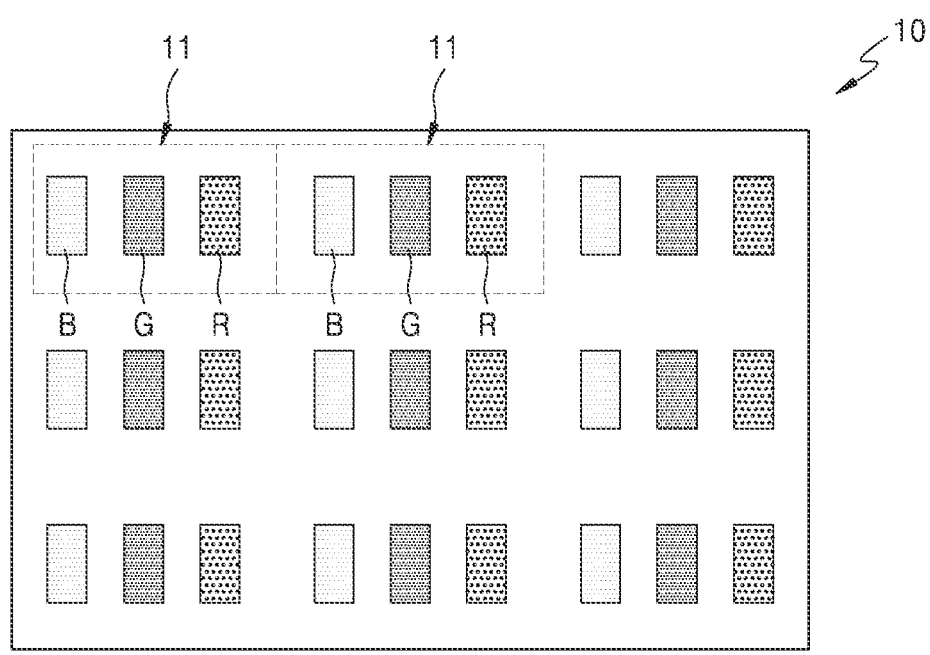
FIG. 4 is a plan view schematically illustrating a display device according to an embodiment.

FIG. 4 is a plan view schematically illustrating a display device according to an embodiment. A display device 10 illustrated in FIG. 4 may be, for example, a micro-LED display device. However, the disclosure is not limited thereto.

Referring to FIG. 4, the display device 10 may include a plurality of unit pixels 11. For convenience, FIG. 4 illustrates nine unit pixels 11. In order for the display device 10 to implement a color image, each of the plurality of unit pixels 11 may include pixels of different colors. For example, each of the unit pixels 11 may include first, second, and third pixels B, G, and R having different colors. For example, the first, second, and third pixels B, G, and R may be blue, green, and red pixels, respectively.

The first, second, and third pixels B, G, and R may respectively include first, second, and third LED devices that emit light of different wavelength bands. For example, in a case where the first, second, and third pixels B, G, and R are blue, green, and red pixels, respectively, the first, second, and third LED devices may be blue, green, and red LED devices, respectively. The first, second, and third LED devices may be the LED devices 1000, 1000', and 1000" according to the above-described embodiments, respectively.

The first, second, and third pixels B, G, and R may include a plurality of LED devices that emit light of the same wavelength band. For example, in a case where the first, second, and third pixels B, G, and R are blue, green, and red pixels, respectively, each of the first, second, and third pixels B, G, and R may include a blue LED device. In this case, the second pixel G that is the green pixel may further include a green color conversion layer that converts blue light into green light, and the third pixel R that is the red pixel may further include a red color conversion layer that converts blue light into red light.

In addition, for example, in a case where the first, second, and third pixels B, G, and R are blue, green, and red pixels, respectively, each of the first, second, and third pixels B, G, and R may include an ultraviolet LED device. In this case, the first pixel B that is the blue pixel may further include a blue color conversion layer that converts ultraviolet light into blue light, the second pixel G that is the green pixel may further include a green color conversion layer that converts ultraviolet light into green light, and the third pixel R that is the red pixel may further include a red color conversion layer that converts ultraviolet light into red light.

FIGS. 5A to 5L are diagrams for describing a method of manufacturing an LED device according to an embodiment.

Figure 5A:
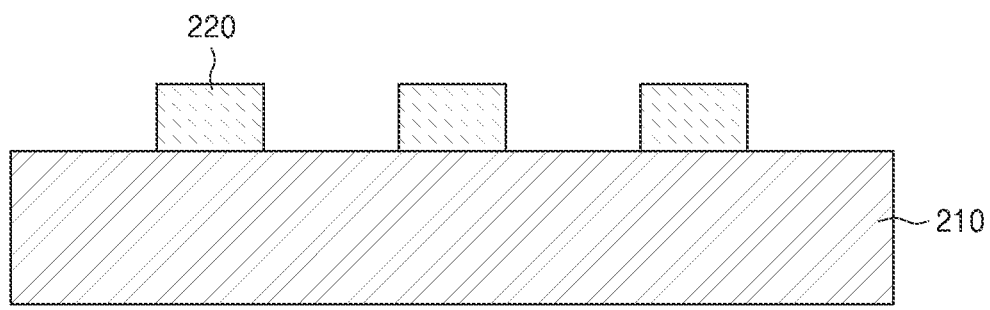
FIGS. 5A to 5L are diagrams for describing a method of manufacturing an LED device according to an embodiment.

Referring to FIG. 5A, sacrificial layer patterns 220 may be formed on a substrate 210. The substrate 210 may include, for example, a sapphire substrate, a silicon substrate, a SiC substrate, a GaAs substrate or the like.

The sacrificial layer pattern 220 may include, for example, photoresists, resins for nanoimprinting, organic nanoparticles, or the like. The sacrificial layer pattern 220 may be formed by, for example, a photolithography method, a nanoimprint method, organic material nanoparticle attachment, or the like. The sacrificial layer patterns 220 may be formed in various shapes as needed, for example, a rectangular bar pattern extending in one direction. The width, number, interval, and/or length of the sacrificial layer patterns 220 may be variously designed in consideration of the size of the LED device to be manufactured. Here, a case where the sacrificial layer patterns 220 are three quadrangular bars arranged in parallel with each other will be described as an example.

Figure 5B:
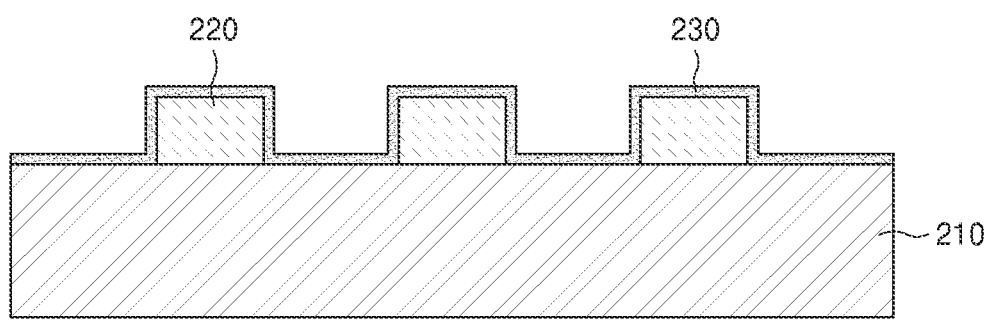

Referring to FIG. 5B, a membrane material layer 230 may be formed on the substrate 210 to cover the sacrificial layer patterns 220. The membrane material layer 230 may be used to form cavities between the membrane material layer 230 and the substrate 210 in a subsequent process, and may be formed at a temperature at which the sacrificial layer pattern 220 is not deformed. The membrane material layer 230 may be formed to a thickness such that the shape of the structure may be stably maintained even after the sacrificial layer patterns 220 are removed.

The membrane material layer 230 may be formed by various methods such as atomic layer deposition (A1000), wet synthesis, metal deposition and oxidation, sputtering, or the like. The membrane material layer 230 may be formed in an amorphous form or a polycrystalline form of fine particles.

The membrane material layer 230 may include, for example, alumina ($Al_2O_3$), and may include, in addition to the alumina ($Al_2O_3$), silica ($SiO_2$), titania ($TiO_2$), zirconia ($ZrO_2$), yttria ($Y_2O_3$)-zirconia, copper oxide (CuO, $Cu_2O$), tantalum oxide ($Ta_2O_5$), aluminum nitride (AlN), silicon nitride ($Si_3N_4$), and the like.

Figure 5C:
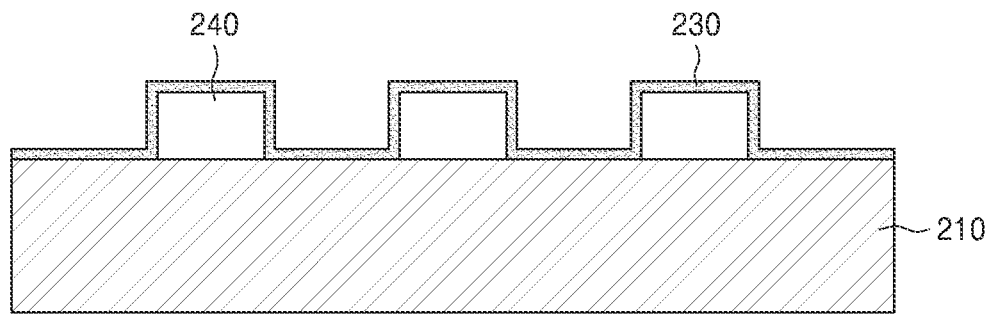

Referring to FIG. 5C, the sacrificial layer patterns 220 may be selectively removed from the substrate 210. The sacrificial layer pattern 220 may be removed by, for example, heating, ashing, or using an organic solvent. A space from which the sacrificial layer pattern 220 is removed may be formed as a cavity 240 by the substrate 210 and the membrane material layer 230.

The membrane material layer 230 formed by the above-described process may be generally amorphous or polycrystalline of significantly small particles. After the sacrificial layer patterns 220 are removed, the membrane material layer 230 may be crystallized by performing a heat treatment to form a membrane 230'. Here, leg parts of the membrane 230' may be formed at both sides of the cavity 240 to be in contact with the substrate 210.

In a case where the substrate 210 and the membrane material layer 230 have the same composition, for example, in a case where the substrate 210 includes a sapphire substrate and the membrane material layer 230 includes alumina, the membrane material layer 230 may be crystallized into the same crystal structure as the substrate 210 by performing a heat treatment at a high temperature, for example, about 1000° C., and thus the membrane 230' may be formed. This is because solid phase epitaxy occurs in a portion of the membrane material layer 230 directly contacting the substrate 210 during the high-temperature heat treatment, and thus the crystallization occurs according to a crystallographic direction of the substrate 210.

The membrane 230' formed by the crystallization process may be formed in a polycrystalline form or a single crystal form including large particles. The membrane 230' on the cavity 240 may serve as a seed layer in growth of an epitaxial layer of a nitride semiconductor in a subsequent process, and thus is preferably crystallized.

Figure 5D:
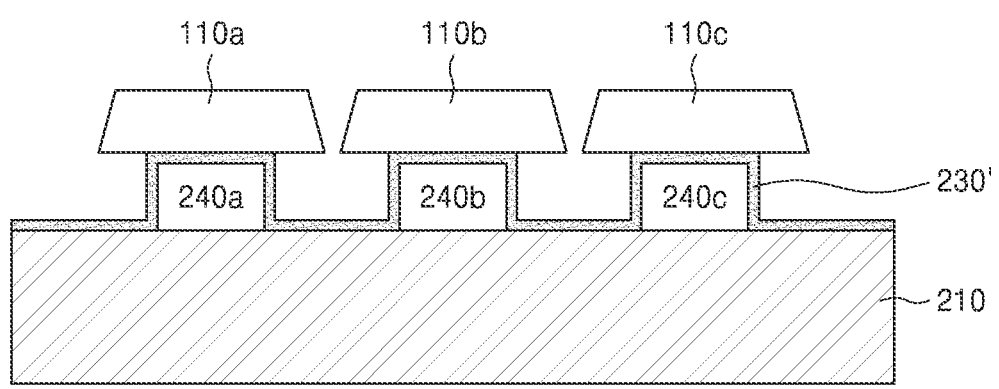

Referring to FIG. 5D, first semiconductor materials 110a, 110b, and 110c may be grown on the membrane 230' on the cavity 240. For example, the first semiconductor materials 110a, 110b, and 110c may be grown on cavities 240a, 240b, and 240c, respectively, by chemical vapor deposition (CVD). The first semiconductor materials 110a, 110b, and 110c may be grown in a shape in which the areas of the bottom surfaces contacting the cavities 240a, 240b, and 240c, respectively, are greater than the areas of the top surfaces thereof, that is, in a trapezoidal shape in cross-section. The first semiconductor materials 110a, 110b, and 110c may be, for example, n-type nitride semiconductors, and may include n-GaN.

Figure 5E:
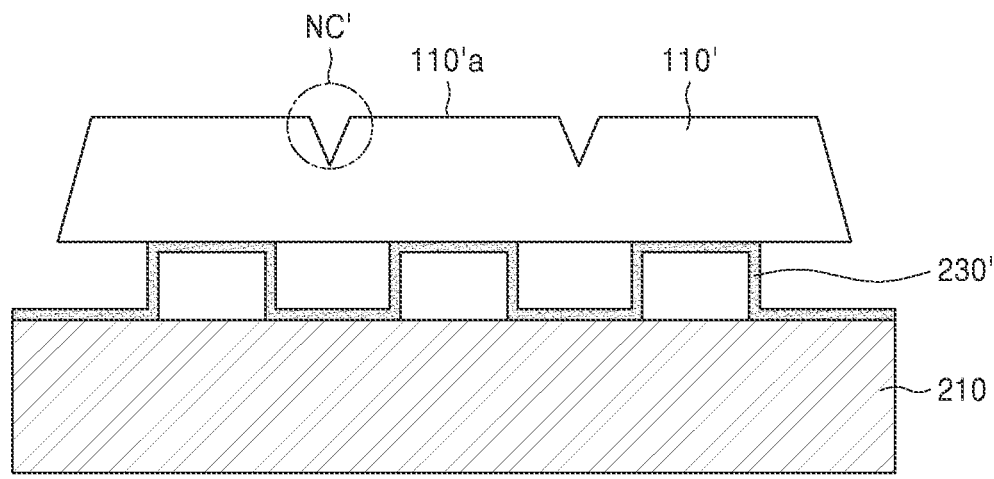
Figure 5F:
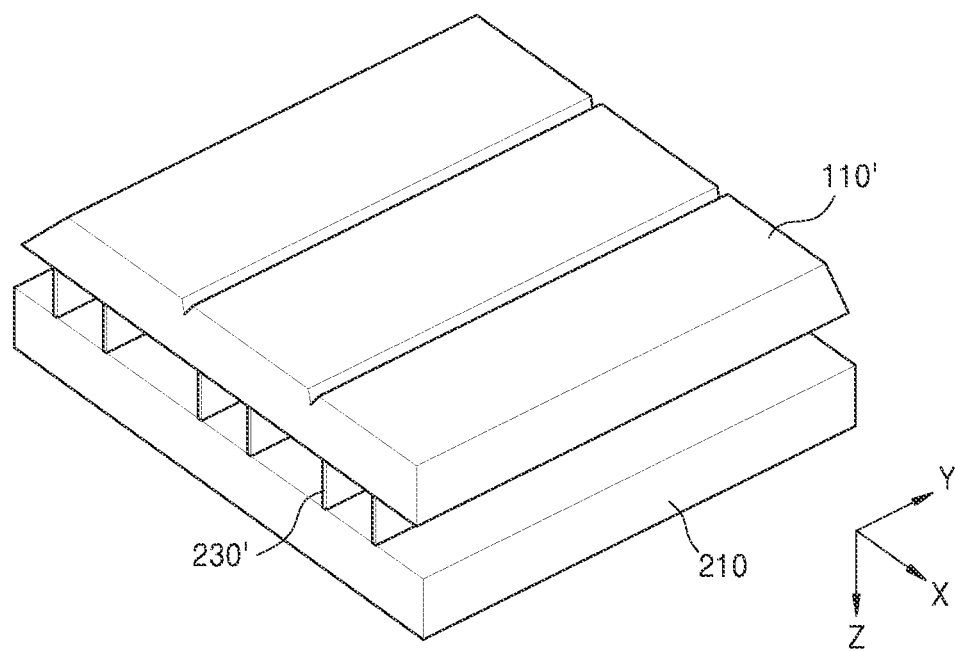

Referring to FIG. 5E, the first semiconductor materials 110a, 110b, and 110c being grown on the cavities 240a, 240b, and 240c, respectively, may be fused with each other from the bottom surfaces into a single mass. The first semiconductor materials 110a, 110b, and 110c may be fused with each other into the first semiconductor layer 110', and the top surface of the first semiconductor layer 110' may be the electrode formation surface 110'a. As the first semiconductor materials 110a, 110b, and 110c are fused with each other, the notch portion NC' may be formed on the electrode formation surface 110'a, a defect may occur at a fusing portion, and thus the defect lines 111 of FIG. 1D may be generated. As the first semiconductor materials 110a, 110b, and 110c are continuously grown, the depth of the notch portion NC' on the electrode formation surface 110'a may gradually decrease. FIG. 5F is a perspective view of the first semiconductor layer 110' of FIG. 5E. As in the first semiconductor layer 110' of FIGS. 5E and 5F, in a case where the LED device is manufactured by stopping the growth of the first semiconductor layer 110' before the notch portion NC' completely disappears, the LED device 1000' including the notch portion NC' as illustrated in FIG. 2A may be manufactured, and, hereinafter, a method of manufacturing the LED device 1000 without the notch portion NC' as illustrated in FIG. 1 will be described as an example.

Figure 5G:
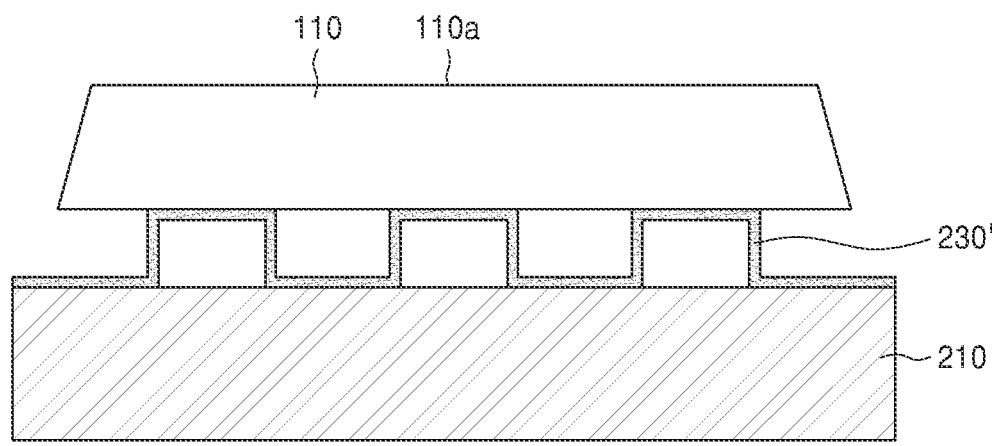

Referring to FIG. 5G, the first semiconductor layer 110' is continuously grown to form the first semiconductor layer 110 on which the notch portion NC' has disappeared and the electrode formation surface 110a is planarized.

Figure 5H:
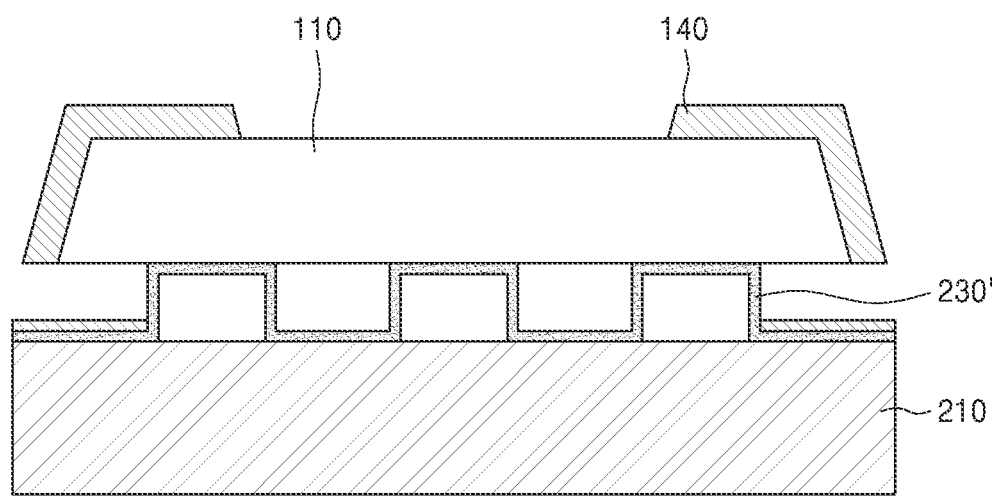

Referring to FIG. 5H, the insulating layer 140 may be formed on a partial region of the first semiconductor layer 110. The insulating layer 140 may be formed in a region larger than the first electrode 150 in consideration of the position and size of the first electrode 150 contacting the first semiconductor layer 110. The insulating layer 140 may be a material that inhibits growth of the active layer and the second semiconductor layer in a subsequent process, and may include, for example, $SiO_2$ or SiN.

Figure 5I:
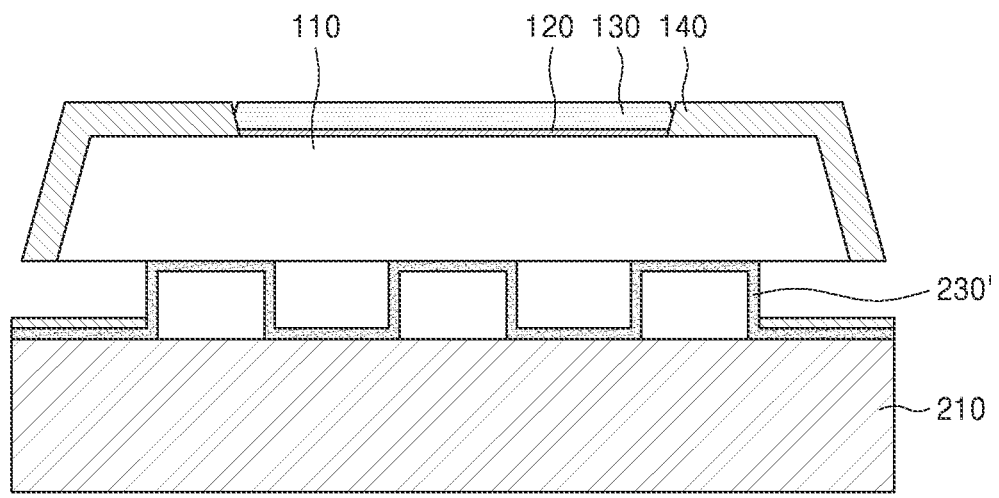

Referring to FIG. 5I, the active layer 120 and the second semiconductor layer 130 may be grown on a region of the first semiconductor layer 110 on which the insulating layer 140 is not formed. For example, the active layer 120 and the second semiconductor layer 130 may be grown by chemical vapor deposition (CVD). The active layer 120 and the second semiconductor layer 130 may include, for example, a nitride semiconductor, and may include GaN, InN, AlN, or a combination thereof.

Figure 5J:
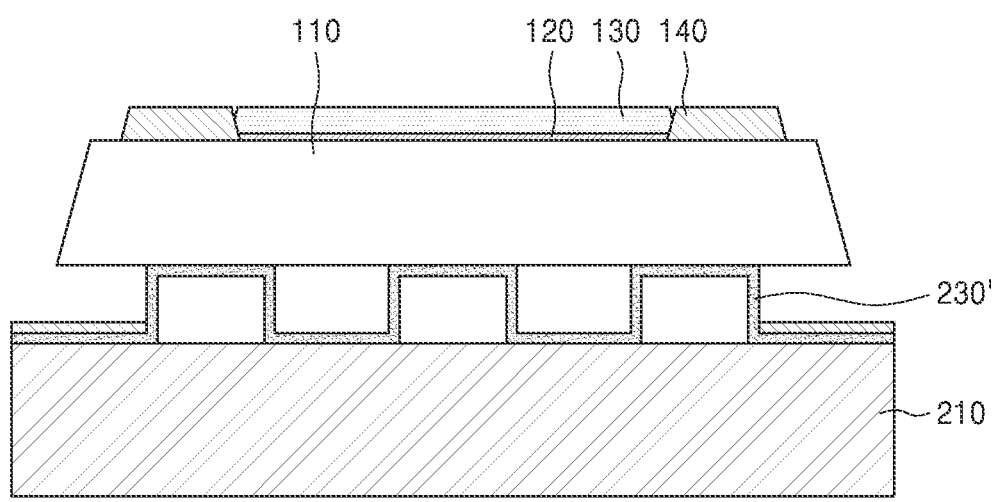

Referring to FIG. 5J, a part of the insulating layer 140 on which the first electrode 150 is to be formed may be removed. A desired part of the insulating layer 140 may be removed by performing a photolithography process.

Figure 5K:
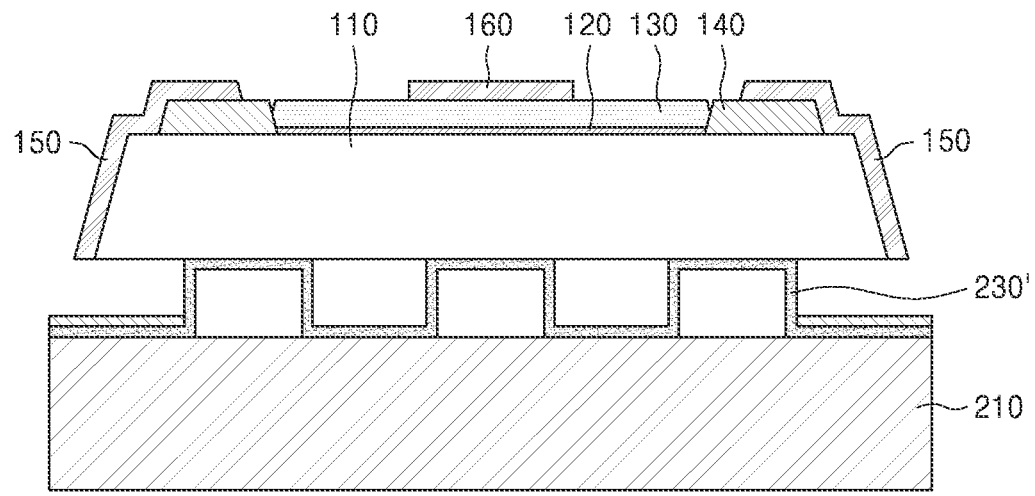

Referring to FIG. 5K, the first electrode 150 may be formed on an exposed portion of the first semiconductor layer 110, and the second electrode 160 may be formed on a partial region of the second semiconductor layer 130. Regions on which the electrodes 150 and 160 are not formed may be covered by a photoresist, and the electrodes 150 and 160 may be formed by depositing a metal material having excellent conductivity by using electron beam deposition or the like.

Figure 5L:
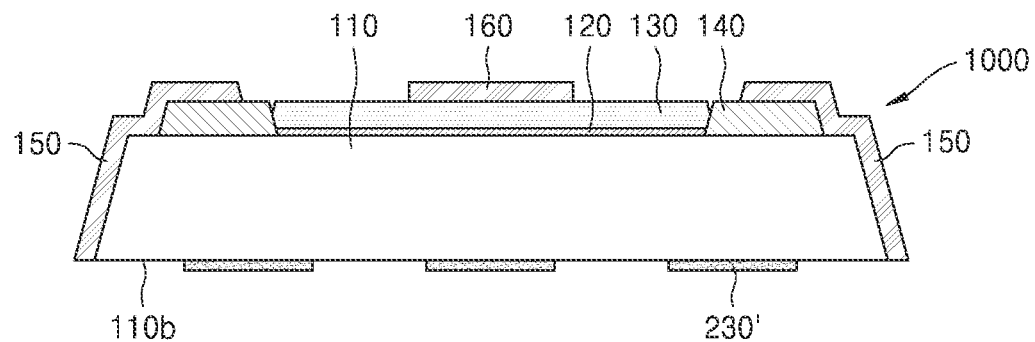
Figure 5L:
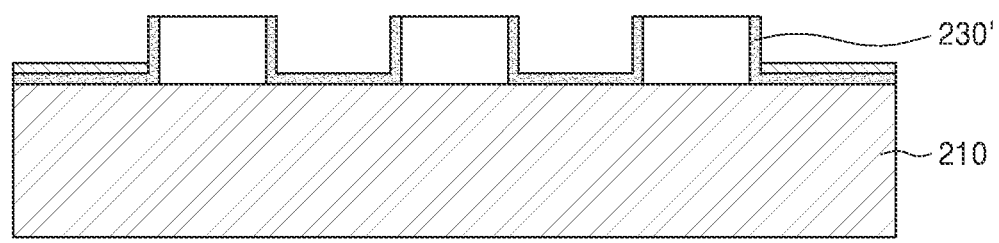

Referring to FIG. 5L, the manufactured LED device 1000 may be separated from the substrate 210. The LED device 1000 may be separated from the substrate 210 by collapsing the leg parts of the membrane 230' by applying a mechanical force. The membrane 230' remaining on the light emission surface 110b of the first semiconductor layer 110 may be removed by using phosphoric acid ($H_3PO_4$) or the like.

Because the method of manufacturing the LED device described above uses the membrane 230', a high-quality device having a low defect density may be manufactured. Because the membrane 230' may distribute, with the light emission layer LEL grown thereon, a stress that may cause dislocation, the light emission layer LEL grown on the membrane 230' may achieve a high quality with a low defect density.

In general, stress caused by a physical difference between a growth substrate and a thin film grown thereon may be converted into elastic energy at an interface, and may be a driving force that causes dislocation. In a normal case, because the thickness of the growth substrate is significantly thicker than the thin film, deformation is difficult, and dislocation is generated in the thin film and thus stress is relieved. Here, in a case where the thin film is grown to a thickness greater than or equal to a preset thickness, the elastic energy at the interface exceeds the generation energy of dislocation, and thus the dislocation starts to be generated. However, in a case where the membrane 230' is thinner than the light emission layer LEL, generation of dislocation in the light emission layer LEL may be suppressed, and thus, the high-quality light emission layer LEL having a low defect density may be formed.

In addition, because the cavity 240 exists between the substrate 210 and the light emission layer LEL, the cavity 240 may consume stress energy by being deformed even in a case where there is a difference in thermal expansion coefficient between the substrate 210 and the light emission layer LEL, accordingly, a thermal stress applied to the light emission layer LEL may be reduced, and a phenomenon that the substrate 210 is bent may be suppressed.

As described above, the light emission layer LEL having excellent physical properties may be formed on the membrane 230' on the cavities 240, and accordingly, a high-quality LED device having high efficiency and high reliability and capable of increasing light extraction efficiency may be implemented.

In addition, because the active layer 120 does not include a region damaged due to an etching process, light emission efficiency may be improved.

The embodiments described above are merely examples, and various modifications may be made by those of skill in the art.

According to an example embodiment, as a light emission layer is grown on a crystallized membrane spaced apart from a substrate with cavities therebetween, a stress that may be generated in the light emission layer may be reduced, and accordingly, a high-quality light emission layer having a low defect density may be manufactured. In addition, because there is no etching region for forming an electrode, there is no reduction in luminance efficiency due to defects that occur in an etching process. Therefore, an LED device having high reliability and high light emission efficiency may be implemented.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A light-emitting diode (LED) device comprising:
    a light emission layer comprising:
        a first semiconductor layer comprising a first surface and a second surface facing the first surface, the second surface having an area larger than an area of the first surface;
        an active layer on the first surface; and
        a second semiconductor layer on the active layer;
    a top surface of an insulating layer on the first surface, the insulating layer defining an open region of the first semiconductor layer;
    a first electrode that contacts the first semiconductor layer at the open region and a bottom surface of the insulating layer opposite to the top surface of the insulating layer; and
    a second electrode on the second semiconductor layer and contacting the second semiconductor layer,
    wherein an angle between a surface of the insulating layer contacting the active layer and the second semiconductor layer and a surface of the insulating layer contacting the first semiconductor layer is less than 90°, and
    wherein the bottom surface of the insulating layer is coplanar to a bottom surface of the second semiconductor layer.

2. The LED device of claim 1, wherein the first electrode contacts the first surface of the first semiconductor layer.

3. The LED device of claim 1, wherein the first and second electrodes comprise reflective electrodes.

4. The LED device of claim 1, wherein the LED device has a size of about 100 µm by about 100 µm or less.

5. The LED device of claim 1, wherein the LED device has a horizontal electrode structure in which at least a part of the first electrode and at least a part of the second electrode are arranged in a direction that faces the first surface.

6. The LED device of claim 1, wherein respective driver connection surfaces of the first and second electrodes are formed at a same distance from the second surface.

7. The LED device of claim 1, wherein the first electrode comprises an extension extending to an upper portion of the insulating layer.

8. The LED device of claim 1, wherein the first semiconductor layer further comprises a defect line formed on the second surface.

9. The LED device of claim 8, wherein the defect line is parallel with an edge of the second surface of the first semiconductor layer.

10. The LED device of claim 1, wherein the first semiconductor layer further comprises a notch portion formed on the first surface and recessed toward the second surface.

11. The LED device of claim 10, wherein the notch portion is formed in a direction parallel with an edge of the LED device.

12. The LED device of claim 1, wherein the first semiconductor layer further comprises a valley portion formed on the first surface along a periphery of the first electrode and recessed toward the second surface.

13. A light-emitting diode (LED) device comprising:
a light emission layer comprising:
a first semiconductor layer comprising a first surface and a second surface facing the first surface, the second surface having an area larger than an area of the first surface;
an active layer on the first surface; and
a second semiconductor layer on the active layer;
an insulating layer on the first surface, the insulating layer defining an open region of the first semiconductor layer;
a first electrode that contacts the first semiconductor layer at the open region; and
a second electrode on the second semiconductor layer and contacting the second semiconductor layer,
wherein an angle between a surface of the active layer contacting the insulating layer and a surface of the active layer contacting the first semiconductor layer is greater than 90°, and
wherein the bottom surface of the insulating layer is coplanar to a bottom surface of the second semiconductor layer.

14. A display device comprising a pixel array in which unit pixels are arranged in a two-dimensional array,
where the unit pixels comprise a first pixel that emits a first color light and a second pixel that emits a second color light,
wherein the first pixel and the second pixel comprise different light-emitting diode (LED) devices from each other,
wherein at least one LED device of the LED devices comprises:
a light emission layer comprising:
a first semiconductor layer comprising a first surface and a second surface facing the first surface, the second surface having an area larger than an area of the first surface;
an active layer on the first surface; and
a second semiconductor layer on the active layer;
a top surface of an insulating layer on the first surface, that defines an open region of the first semiconductor layer;
a first electrode that contacts the first semiconductor layer at the open region and a bottom surface of the insulating layer opposite to the top surface of the insulating layer; and
a second electrode on the second semiconductor layer and contacting the second semiconductor layer,
wherein an angle between a surface of the insulating layer contacting the active layer and the second semiconductor layer and a surface of the insulating layer contacting the first semiconductor layer is less than 90°, and
wherein the bottom surface of the insulating layer is coplanar to a bottom surface of the second semiconductor layer.

15. The display device of claim 14, wherein the first electrode contacts the first surface of the first semiconductor layer.

16. The display device of claim 14, wherein the first and second electrodes comprise reflective electrodes.

17. The display device of claim 14, wherein the LED device has a size of about 100 µm by about 100 µm or less.

18. The display device of claim 14, wherein the at least one LED device has a horizontal electrode structure in which at least a part of the first electrode and at least a part of the second electrode are arranged in a direction that faces the first surface.

19. The display device of claim 14, wherein respective driver connection surfaces of the first and second electrodes are formed at a same distance from the second surface.

20. The display device of claim 14, wherein the first electrode comprises an extension extending to an upper portion of the insulating layer.

21. The display device of claim 14, wherein the first semiconductor layer further comprises a defect line formed on the second surface.

22. The display device of claim 21, wherein the defect line is parallel with an edge of the second surface of the first semiconductor layer.

23. The display device of claim 14, wherein the first semiconductor layer further comprises a notch portion formed on the first surface and recessed toward the second surface.

24. The display device of claim 23, wherein the notch portion is formed in a direction parallel with an edge of the at least one LED device.

25. The display device of claim 14, wherein the first semiconductor layer further comprises a valley portion formed on the first surface along a periphery of the first electrode and recessed toward the second surface.

* * * * *